(12) United States Patent
Karp et al.

(10) Patent No.: US 8,982,581 B2
(45) Date of Patent: Mar. 17, 2015

(54) ELECTRO-STATIC DISCHARGE PROTECTION FOR DIE OF A MULTI-CHIP MODULE

(75) Inventors: James Karp, Saratoga, CA (US);
Michael J. Hart, San Jose, CA (US);
Mohammed Fakhruddin, San Jose, CA (US); Steven T. Reilly, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 381 days.

(21) Appl. No.: 12/828,007

(22) Filed: Jun. 30, 2010

(65) Prior Publication Data
US 2012/0002392 A1 Jan. 5, 2012

(51) Int. Cl.
*H05K 7/00* (2006.01)
*H01R 43/00* (2006.01)
*H01L 23/60* (2006.01)
*H01L 25/065* (2006.01)
*H01L 27/02* (2006.01)

(52) U.S. Cl.
CPC ............ *H01L 23/60* (2013.01); *H01L 25/0655* (2013.01); *H01L 25/0657* (2013.01); *H01L 27/0255* (2013.01); *H01L 2225/06572* (2013.01); *H01L 2924/14* (2013.01); *H01L 2924/15787* (2013.01); *H01L 2224/16225* (2013.01); *H01L 2224/73253* (2013.01); *H01L 2924/15192* (2013.01); *H01L 2924/15311* (2013.01); *H01L 2924/19107* (2013.01)
USPC ............. 361/820; 361/56; 361/825; 257/355; 257/173

(58) Field of Classification Search
CPC . H01L 25/0657; H01L 23/60; H01L 2924/14; H01L 27/0255

USPC ........................ 361/820, 56; 29/825; 257/355
See application file for complete search history.

(56) References Cited

U.S. PATENT DOCUMENTS

| 5,504,439 A * | 4/1996 | Tavana ............................. 326/38 |
| 6,232,814 B1 * | 5/2001 | Douglas, III .................. 327/281 |
| 6,737,743 B2 | 5/2004 | Urakawa |
| 7,894,172 B2 * | 2/2011 | Pan et al. ........................ 361/56 |
| 2004/0105203 A1 * | 6/2004 | Ker et al. ........................ 361/56 |
| 2005/0269659 A1 | 12/2005 | Huang |
| 2008/0296697 A1 * | 12/2008 | Hsu et al. ...................... 257/379 |
| 2009/0085599 A1 * | 4/2009 | Choi et al. ..................... 324/765 |
| 2009/0290271 A1 * | 11/2009 | Yang et al. ...................... 361/56 |
| 2010/0127359 A1 | 5/2010 | Bazarjani et al. |
| 2010/0264954 A1 * | 10/2010 | Drost et al. ..................... 326/30 |

FOREIGN PATENT DOCUMENTS

| GB | 2 370 691 A | | 7/2002 | |
| JP | 2007-173443 | * | 5/2005 | ............ H01L 21/822 |
| JP | 2007-173443 | | 7/2007 | |

\* cited by examiner

*Primary Examiner* — Jayprakash N Gandhi
*Assistant Examiner* — Mukund G Patel
(74) *Attorney, Agent, or Firm* — W. Eric Webostad; Gerald Chan (57) ABSTRACT

Electro-static discharge ("ESD") protection for a die of a multi-chip module is described. A contact has an externally exposed surface after formation of the die and prior to assembly of the multi-chip module. The contact is for a die-to-die interconnect of the multi-chip module. The contact is for an internal node of the multi-chip module after the assembly of the multi-chip module. A driver circuit is coupled to the contact and has a first input impedance. A discharge circuit is coupled to the contact for electrostatic discharge protection of the driver circuit and has a first forward bias impedance associated with a first discharge path. The first forward bias impedance is a fraction of the first input impedance.

19 Claims, 7 Drawing Sheets

ELECTRO-STATIC DISCHARGE PROTECTION FOR DIE OF A MULTI-CHIP MODULE

FIELD OF THE INVENTION

An embodiment of the invention relates to integrated circuit devices ("ICs"). More particularly, the embodiment of the invention relates to electro-static discharge ("ESD") protection for an IC of a multi-chip module.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

PLDs, as well as other types of ICs, may be combined with other types of ICs to form a Multi-Chip Module ("MCM"). Prior to final stages of packaging an MCM, individual semiconductor die ("die") or ICs, for example a PLD die and a memory die, may have pins, micro bumps, balls, or other external contacts. These exposed contacts in some instances are used for interconnecting two die to form an MCM, and thus after packaging of an MCM such previously external contacts form internal nodes of the MCM which are not exposed.

During assembly of an MCM, such exposed contacts may be exposed to electro-static discharge ("ESD"). Accordingly, it would be desirable and useful to provide means to protect some exposed contacts of die used in an MCM against damage due to ESD.

SUMMARY OF THE INVENTION

One or more embodiments generally relate to integrated circuit devices ("ICs") and, more particularly, to electro-static discharge ("ESD") protection for an IC of a multi-chip module.

An embodiment relates generally to a die for a multi-chip module. A contact has an externally exposed surface after formation of the die and prior to assembly of the multi-chip module. The contact is for a die-to-die interconnect of the multi-chip module. The contact is for an internal node of the multi-chip module after the assembly of the multi-chip module. A driver circuit is coupled to the contact and has a first input impedance. A discharge circuit is coupled to the contact for electrostatic discharge protection of the driver circuit and has a first forward bias impedance associated with a first discharge path. The first forward bias impedance is a fraction of the first input impedance.

Another embodiment relates generally to a multi-chip module. In such an embodiment, a first die has a first contact, and a second die has a second contact. The first die and the second die are attached to a substrate. The first contact and the second contact are coupled to one another via a conductor of the substrate to provide an internal node after assembly of the multi-chip module. An input driver of the first die is coupled to the first contact, and an output driver of the second die is coupled to the second contact. The input driver has a first input impedance, and the output driver has a second input impedance. A first discharge circuit of the first die coupled to the first contact for first electrostatic discharge protection, and a second discharge circuit of the second die coupled to the second contact for second electrostatic discharge protection. The first discharge circuit has a first forward bias impedance, and the second discharge circuit has a second forward bias impedance. The first forward bias impedance is a fraction of the first input impedance, and the second forward bias impedance is a fraction of the second input impedance.

Yet another embodiment is a method of providing a multi-chip module. In such an embodiment, a first die is obtained with a first contact coupled to an input driver and a first discharge circuit. A second die is obtained with a second contact coupled to an output driver and a second discharge circuit. The input driver has a first input impedance, and the output driver has a second input impedance. The first discharge circuit of the first die is coupled to the first contact for electrostatic discharge protection of the input driver. The second discharge circuit of the second die is coupled to the second contact for electrostatic discharge protection of the output driver. The first discharge circuit has a first forward bias impedance, and the second discharge circuit has a second forward bias impedance. The first contact and the second contact are interconnected. The multi-chip module is packaged. The first contact, the second contact, and an interconnect between the first contact and the second contact are completely concealed after the packaging of the multi-chip module. The first forward bias impedance is a fraction of the first input impedance, and the second forward bias impedance is a fraction of the second input impedance.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
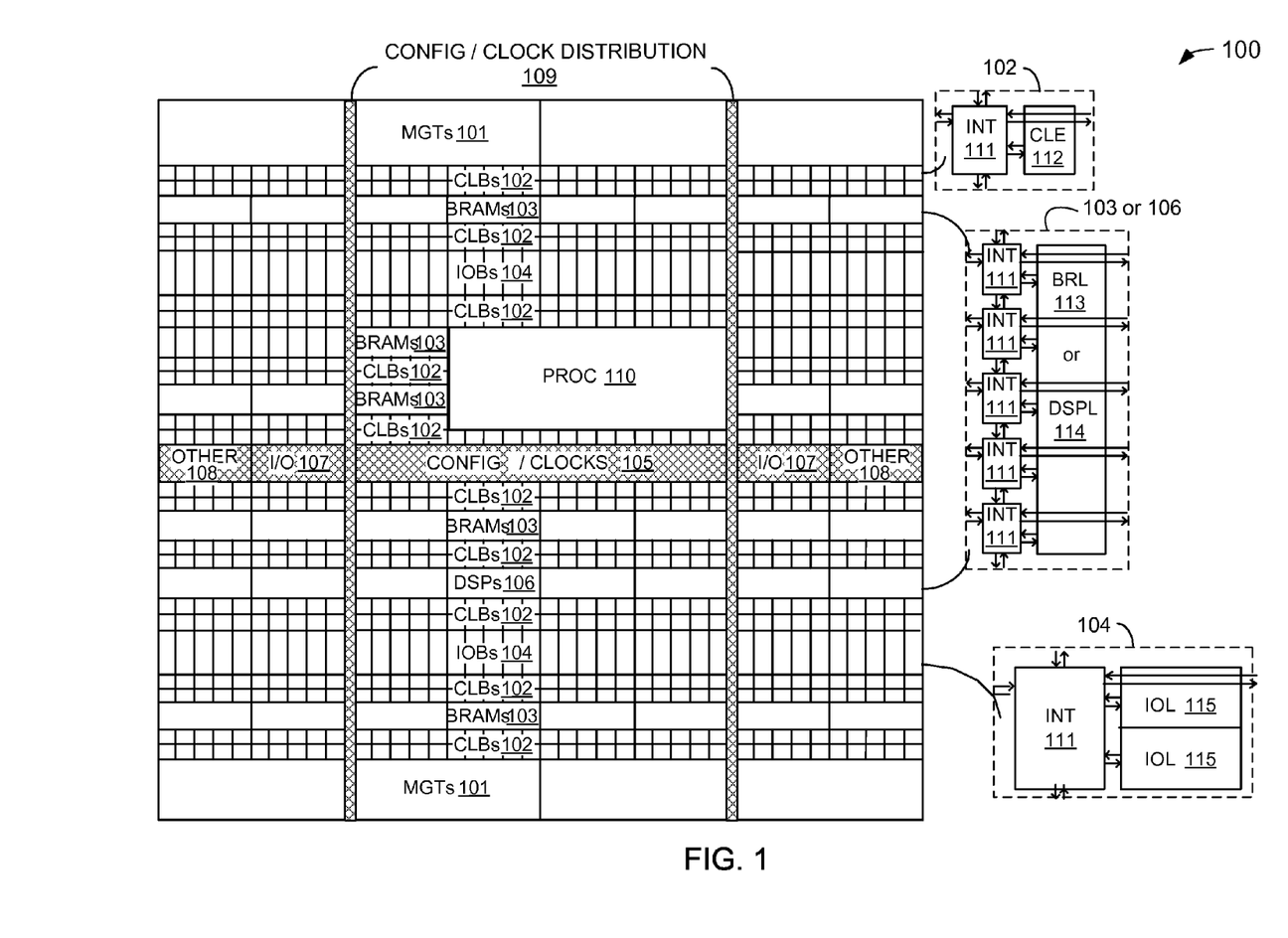
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several rows of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2A:
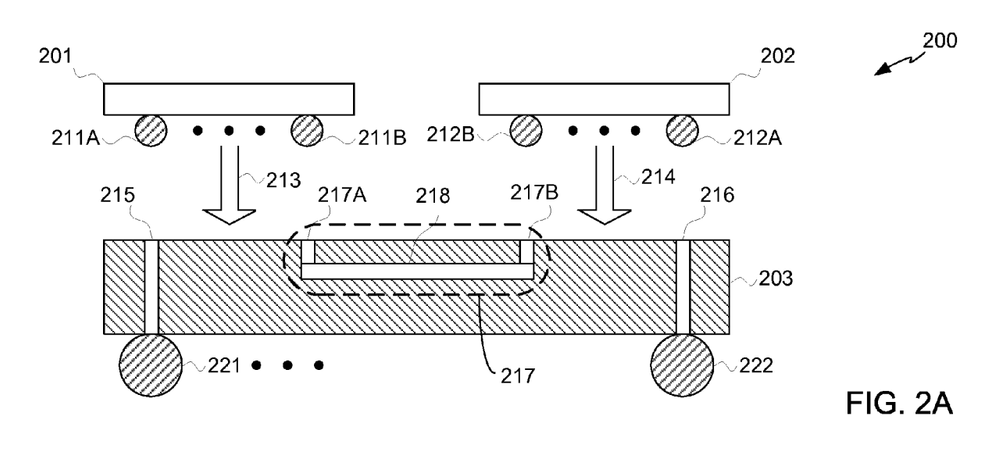
FIG. 2A is cross-sectional view depicting an exemplary embodiment of an in-process multiple-chip module ("MCM").

FIG. 2A is cross-sectional view depicting an exemplary embodiment of an in-process multiple-chip module ("MCM") 200. MCM 200 includes die 201, die 202, and substrate 203. Substrate 203 may be any of a laminated substrate, a deposited substrate, or a ceramic substrate, as are known. Furthermore, any other substrate 203 suitable for having die 201 and 202 attached thereto may be used. Die 201 and 202 each have multiple contacts, such as generally indicated by balls 211 and 212, respectively. Arrows 213 and 214 respectively indicate that die 201 and 202 are to be attached to conductors of substrate 203.

Substrate 203 may include conductive lines, such as Through-Silicon-Via ("TSV") conductive lines 215 and 216; die-to-die ("dtd") microbumps and conductive lines such as conductive line 217 or any other type of conductive lines capable of communicating signals. Conductive lines 215 and 216 extended vertically through substrate 203 respectively to balls 221 and 222. In this exemplary embodiment, conductive line 217 may be formed of optional separate vertical contacts 217A and 217B connecting to a generally horizontal trace 218, which may be a surface level trace or a subsurface level trace, as illustratively depicted, of substrate 203.

In this exemplary embodiment, balls or ball-like bumps 211 and 212 for example may be what are known as microbumps ("μ-bumps"), and balls 221 and 222 for example may be what are known as "C4" balls. It should be understood that other types of interconnect interfaces for MCMs may be used. Balls 211B and 212B respectively are attached to contacts 217A and 217B of conductive line 217. Balls 211A and 212A are respectively attached to conductive lines 215 and 216.

Figure 2B:
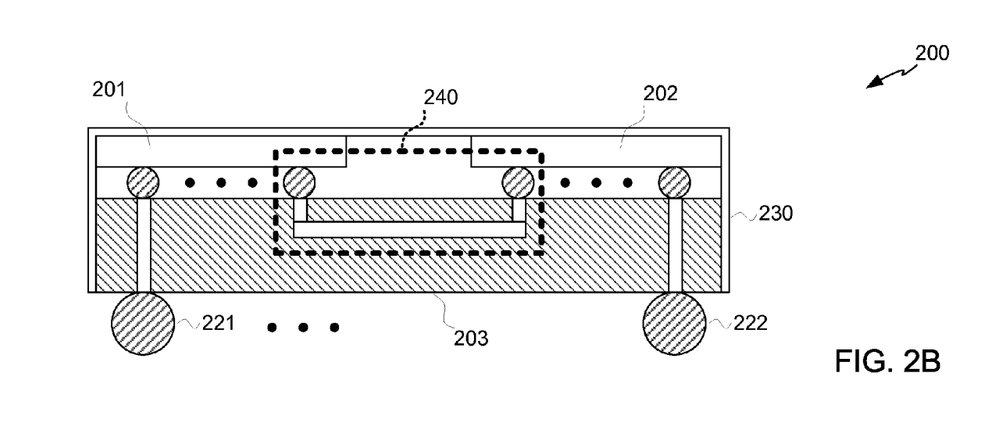
FIG. 2B is the cross-sectional view of FIG. 2A after assembling and packaging the MCM of FIG. 2A.

FIG. 2B is the cross-sectional view of FIG. 2A after assembling and packaging MCM 200. With simultaneous reference to FIGS. 2A and 2B, MCM 200 is further described.

It should be understood that MCM 200 is a horizontal chip package. In other words, die 201 and 202 are generally horizontally disposed with respect to one another, though not necessarily abutting one another, within MCM 200. A cover 230 may be used to protect die 201 and 202, as well as their attachment to substrate 203. Balls 211B and 212B, as well as conductive line 217, form an interior node 240 as generally indicated by a dashed box, of MCM 200. Balls 221 and 222 however, are exposed to an outer environment after packaging MCM 200. Thus, it should be understood that after packaging, balls 221 and 222 are susceptible to electrostatic discharge ("ESD"), and in contrast, interior node 240 is generally isolated from ESD after packaging. However, during assembly, as generally indicated in FIG. 2A, balls 211B and 212B, as well as balls 211A and 212A, are susceptible to ESD. However, circuitry in die 201 and die 202 associated with balls 211A and 212A may be protected with conventional ESD circuitry for contacts effectively exposed to possible external ESD current conduction. It should be understood that internal dtd interconnects may be formed with microbumps and interconnected conductive traces, and that MCM die to external PCB interconnects may for example be formed with microbumps, TSVs, and C4 balls.

Figure 3A:
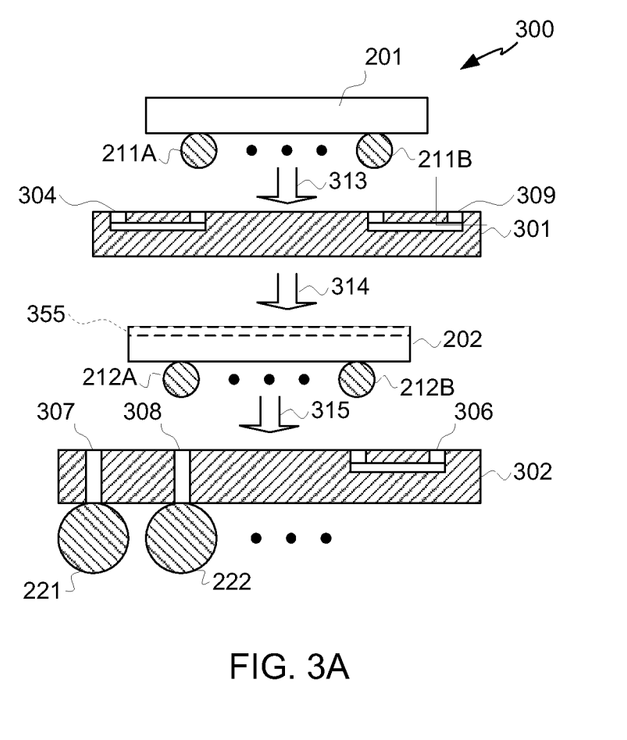
FIG. 3A is a cross-sectional view depicting an exemplary embodiment of an in-process MCM.

FIG. 3A is a cross-sectional view depicting an exemplary embodiment of an in-process MCM 300. MCM 300 includes die 201, die 202, substrate 301, and substrate 302. In this exemplary embodiment, substrate 301, which is sometimes referred to as an interposer, is located between die 201 and die 202. In this embodiment, the interposer 301 is a passive interposer; however, interposer 301 may optionally be an active interposer, namely with one or more transistors formed using interposer 301 as a substrate for such transistor formation. Thus, optionally, a die-to-die coupling may be for a die-to-die vertical stacking, where an interposer 301 is effectively built into or directly attached, namely "integral," to a substrate of a die, such as generally indicated by optional block 355 of die 202, for more direct interconnect of dtd contacts. In such an option, through-hole vias (not shown) in die 202 may be used for forming interconnects. However, for purposes of clarity, it shall be assumed that a non-integral or separate one or more conductive layer laminate substrate is used for interposer 301.

Substrate 301 includes conductive lines 304 and 305, which may be formed similarly with respect to conductive line 217 of FIG. 2A, as previously described. Substrate 302 includes conductive lines 306 through 308. Conductive line 306 may be formed similarly with respect to conductive line 217 as described with reference to FIG. 2A, and conductive lines 307 and 308 may be formed similarly to conductive lines 215 and 216, where conductive lines 307 and 308 extend generally vertically through substrate 302 respectively to provide contacts to balls 221 and 222.

As generally indicated by arrow 313, die 201 is attached to substrate 301. As generally indicated by arrow 314, substrate 301 is disposed above and may be attached to or put in contact with die 202. A paste, not shown, may be used in some embodiments for attaching substrate 301 to die 202. Arrow 315 generally indicates that die 202 is attached to substrate 302.

Figure 3B:
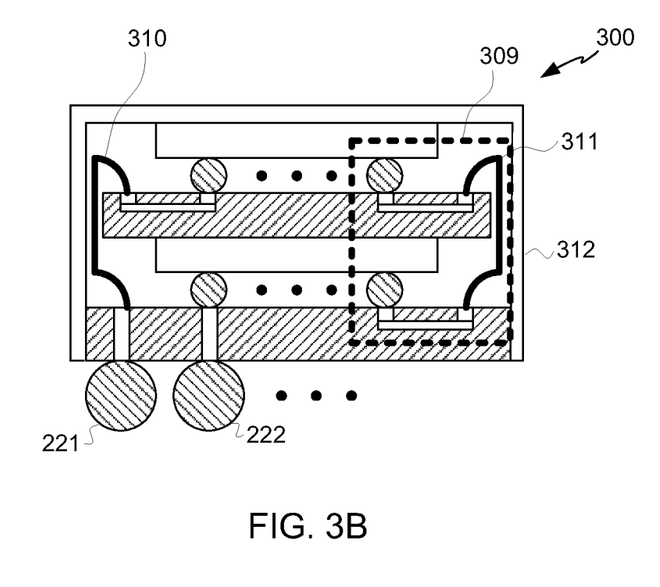
FIG. 3B is the cross-sectional view of FIG. 3A after assembling and packaging of the MCM of FIG. 3A.

FIG. 3B is the cross-sectional view of FIG. 3A after assembling and packaging of MCM 300. In the exemplary embodiment of MCM 300, a vertical chip-stacked package MCM is illustratively depicted. A cover 312 may be used for environmental protection of die 201, die 202, interposer 301, and in part substrate 302, as well as wire bonds 310 and 311 and balls 211 and 212. With simultaneous reference to FIGS. 3A and 3B, MCM 300 is further described.

Wire bond 310 may be used to interconnect conductive line 304 to conductive line 307. Wire bond 311 may be used to interconnect conductive line 305 to conductive line 306. Conductive line 307 is connected to ball 221. Ball 212A is coupled to ball 222 via conductive line 308. Ball 211A is connected to line 304. Ball 211B is connected to line 305. Wire bond 311 is used to interconnect conductive line 305 to conductive line 306. Ball 212B is connected to conductive line 306. Thus, it should be understood that an interior node 309 of MCM 300 is formed by balls 211B and 212B, conductive lines 305 and 306, and wire bond 311. Moreover, ball 211A is coupled to ball 211 via conductive line 304, wire bond 310, and conductive line 307.

After packaging, which may include placing a cover 312 to protect some components of MCM 300, balls 211A, 212A, 221, and 222 are effectively exposed to possible ESD, and balls 211B and 212B are not exposed to ESD after packaging. However, balls 211B and 212B are exposed to possible ESD during assembly of MCM 300. Even though the example of covers 230 and 312 are used herein with reference to FIGS. 2B and 3B, it should be understood that other ways of packaging an MCM may be used, including partial or complete encapsulation with an encapsulation material.

It should be understood that a horizontal chip package or a vertical chip-stack package may be used. It should further be understood that ESD protection for contacts to exterior balls, such as balls 221 and 222, as well as balls generally directly interconnected thereto, such as balls 211A and 212A, may have associated therewith conventional ESD protection, where such ESD protection is embodied in die 201 and 202, though not illustratively depicted in the above described figures. Such ESD protection is generally to protect against possible extreme ESD, which tends to be in excess of 1,000 volts. However, to use conventional exterior ESD protection for MCM interior nodes would significantly harm performance and consume die area.

In the past, die 201 and 202 may have been formed as a single die, rather than two separate die, in which embodiment interior nodes, as generally indicated by balls 211B and 212B, may not have been exposed to ESD during assembly handling. In other words, such interior nodes would be within die on a wafer, and thus would be protected. However, because multiple die are used, interior nodes may be exposed for interconnect during assembly. Rather than putting conventional exterior ESD protection handling on balls associated with such interior nodes, such ESD protection is reduced as described herein.

A reduced level of ESD protection may be used due to a more controlled environment in which MCMs 200 and 300 are assembled. In this exemplary embodiment, a 100-volt human body model ("HBM") is used for such ESD protection. Furthermore, such ESD protection is sufficient to steer current related to ESD into ESD elements, namely diodes as described below in additional detail, where the resistance of such discharge paths is significantly less than resistance of signal path. In other words, resistance of ESD paths are specified as a fraction of the resistance value of associated signal paths. It should be understood that ESD protection of MCM interior nodes is substantially less than conventional ESD protection of exterior nodes, and thus such low level ESD protection has less impact on performance and die area than conventional ESD protection.

Figure 4A:
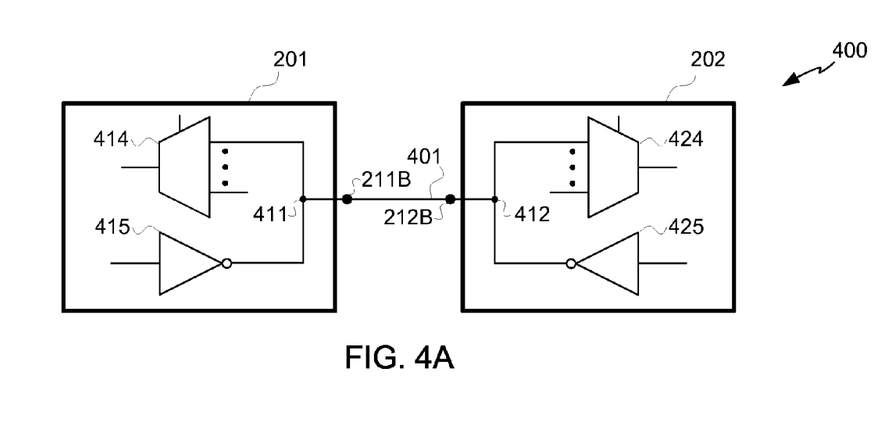
FIG. 4A is a block/circuit diagram depicting an exemplary embodiment of an MCM with a die coupled to another die via a conductive line.

FIG. 4A is a block/circuit diagram depicting an exemplary embodiment of an MCM 400 with a die 201 coupled to a die 202 via a conductive line 401. Conductive line 401 of MCM 400 may be used for communicating data between die 201 and 202.

Conductive line 401 may be a substantially long line, conventionally referred to as a "Super Long Line." Super Long Line 401 may be formed as dtd interconnect, namely conductive line 401 with for example a microbump 211B and a microbump 212B connected at respective ends. Conductive line 401 via balls 211B and 212B is connected to dtd interface nodes 411 and 412. It should be understood that dtd interface nodes 411 and 412 are for internal MCM coupling, and thus are to be differentiated from conventional I/O, the latter term of which is generally understood to be used for external interfaces that drive board lines and have relatively high ESD immunity. Thus, dtd interface nodes, such as pads for example, 411 and 412 are internal package interconnects that may be connected to balls 211B and 212B, such as microbumps or other types of contact interconnects. Accordingly, balls 211B and 212B may be associated with dtd interface nodes 411 and 412, respectively. An input of multiplexer 414 of die 201 may be coupled to dtd interface node 411. Furthermore, an output of inverter 415 of die 201 may be coupled to dtd interface node 411. Likewise, an input of multiplexer 424 of die 202 may be coupled to dtd interface node 412, and an output of inverter 425 of die 202 may be coupled to dtd interface node 412.

It should be understood that inverters 415 and 425 are forms of output drivers. Even though output drivers are illustratively depicted as inverters, it should be understood that other types of output drivers, such as multiplexers or buffers for example, may be used. Furthermore, it should be understood that multiplexers 414 and 424 are illustratively depicted as input drivers. However, it should be understood that other types of input drivers, such as inverters or buffers for example, may be used.

Figure 4B:
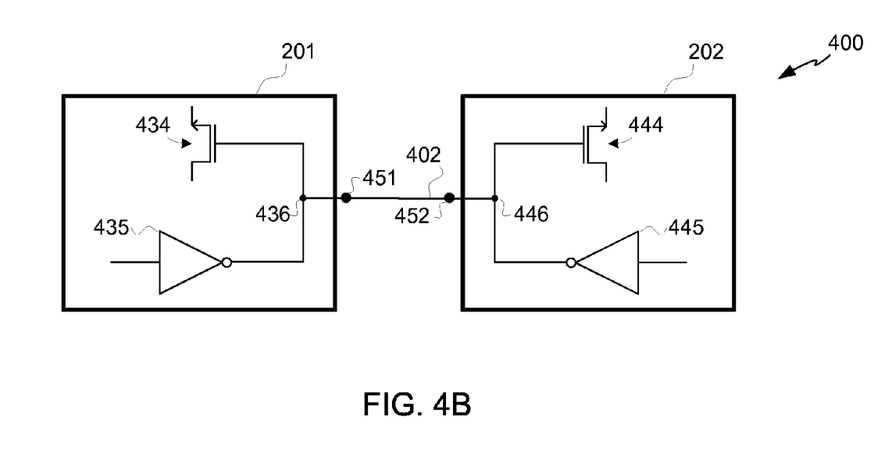
FIG. 4B is a block/circuit diagram depicting an exemplary embodiment of the MCM of FIG. 4A for clock coupling.

FIG. 4B is a block/circuit diagram depicting an exemplary embodiment of MCM 400 for clock coupling. Moreover, even though clock coupling is described with reference to FIG. 4B, coupling as illustratively depicted in FIG. 4B may likewise be used for transmission of configuration data, such as in the context of a PLD or other IC with programmable resources for example.

In FIG. 4B, die 201 includes n-type transistor 434 and inverter 435, as well as dtd interface node 436, and die 202 includes n-type transistor 444, inverter 445, and dtd interface node 446. A conductive line 402, which may be a surface or subsurface line on a substrate 203 of FIG. 2B, or on an interposer 301 of FIG. 3B, is used to couple dtd interface node 436 and 446 to one another via balls, such as microbumps or other types of internal package interconnects 451 and 452.

A gate of n-type transistor 434 is coupled to dtd interface node 436, and an output of inverter 435 is coupled to dtd interface node 436. Likewise, a gate of transistor 444 is coupled to dtd interface node 446, and an output of inverter 445 is coupled to dtd interface node 446. Once again, inverters are illustratively depicted as output drivers; however, other types of circuits may be used for output drivers. Furthermore, even though n-type transistors are illustratively depicted, it should be understood that p-type transistors may be used for gated input drivers.

Figure 5A:
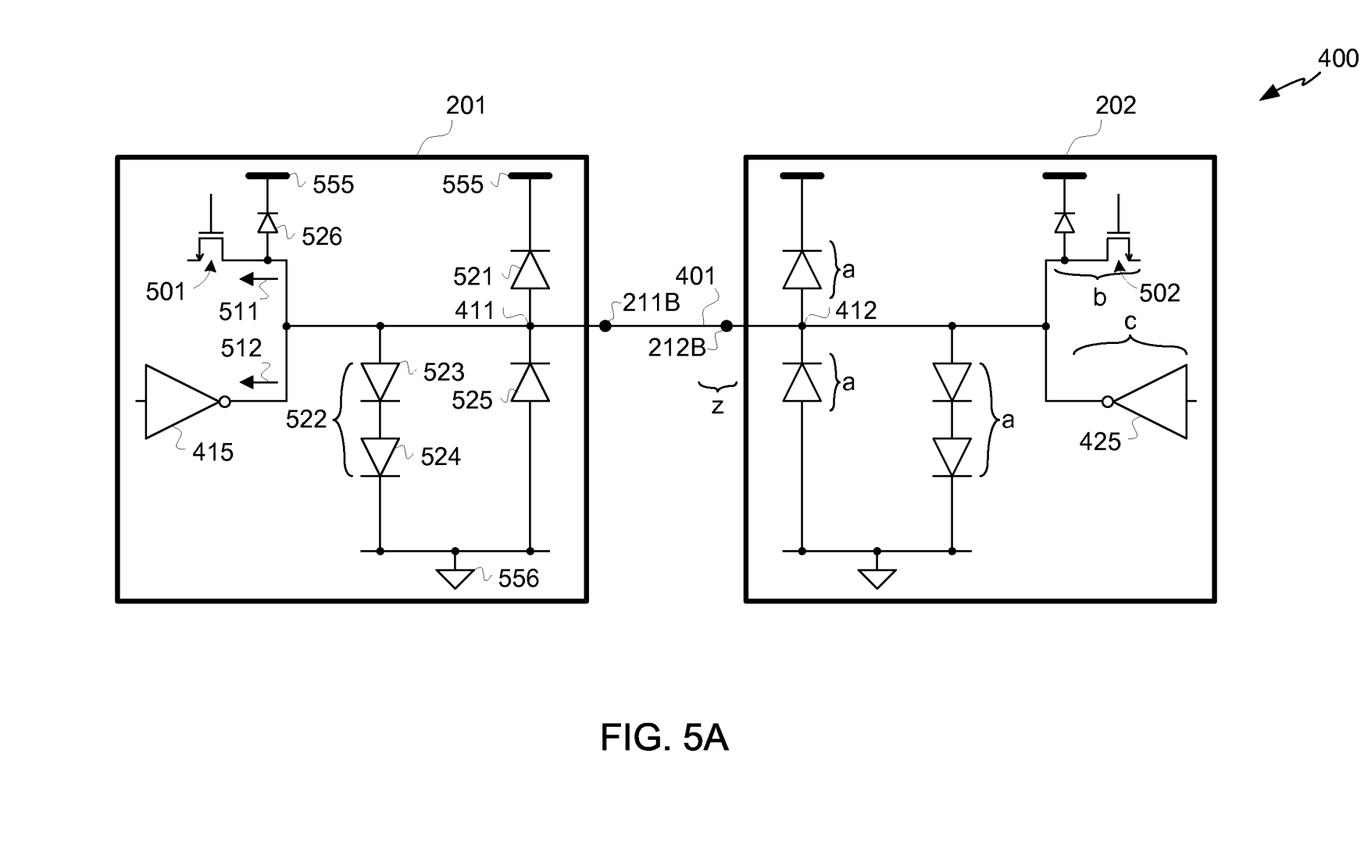
FIG. 5A is a block/circuit diagram depicting the exemplary embodiment of FIG. 4A with the addition of ESD circuitry.

FIG. 5A is a block/circuit diagram depicting the exemplary embodiment of FIG. 4A with the addition of ESD circuitry, as described below in additional detail. MCM 400 includes balls 211B and 212B, which are contacts that are externally exposed after the formation of die 201 and 202 but prior to assembly of MCM 400. It should further be understood that balls 211B and 212B are for a dtd interconnect of MCM 400 via a conductive line 401. Thus, after assembly of MCM 400, balls 211B and 212B, as well as conductive line 401, are of a dtd internal node of MCM 400.

Instead of depicting multiplexers 414 and 424, n-type transistors configured as pass gates, namely transistor 501 of die 201 and transistor 502 of die 202, are illustratively depicted for clarity. A source/drain node of transistor 501 is coupled to dtd interface node 411, and likewise a source/drain node of transistor 502 is coupled to dtd interface node 412. Even though transistor 501 and inverter 415, for example, in combination may be thought of as a driver circuit, it should be understood that transistor 501 is an input driver, and inverter 415 is an output driver with respect to direction of data, control, or other information to and from die 201 via dtd interface node 411. Moreover, it should further be understood that it is not necessary to have both an input and an output driver coupled to dtd interface node 411. For example, dtd interface node 411 could be an input node, in which embodiment only an input driver may be coupled thereto, or node 411 may be an output node, in which embodiment only an output driver may be coupled thereto.

Input driver 501 has an input resistance as generally indicated by input resistance arrow 511. Furthermore, output driver 415 has an input resistance as generally indicated by input resistance arrow 512. In other words, both input and output drivers have associated input impedances. It should be understood that a parasitic diode 526, as associated with transistor 501 of a multiplexer, may be coupled between dtd interface node 411 and power bus 555 in a forward biased direction. Such parasitic diode 526 may be accounted for in ESD protection, but is ignored herein for purposes of clarity.

An ESD circuit, namely diode 521, is coupled in a forward bias direction from dtd interface node 411 to power bus 555. In other words, an input side of diode 521 is coupled to dtd interface node 411, and an output side of diode 521 is coupled to power bus 555. ESD circuit 522 is formed of diodes 523 and 524 coupled in series in a forward biased direction from dtd interface node 411 to ground bus 556. In other words, dtd interface node 411 is coupled to an input side of diode 523; an output side of diode 523 is coupled to an input side of diode 524, and an output side of diode 524 is coupled to ground bus 556. In this embodiment, ESD circuit 525 is provided a reverse-biased diode coupled to dtd interface node 411. In other words, an input side of diode 525 is coupled to ground bus 556, and an output side of diode 525 is coupled to dtd interface node 411.

Thus, it should be understood that for a positive ESD charge on microbump 211B, ESD current is coupled through ESD circuit 522 to ground bus 556. If such positive charge is sufficient to overcome the positive charge on power bus 555, namely to forward biased diode 521, then such ESD current is conducted from dtd interface node 411 to power bus 555 via diode 521. As voltage on power bus 555 may generally be 5 or less volts and ESD may generally be greater than 5 volts, sufficient ESD protection may be provided with diodes 521 for positive charge. Even more particularly, an embodiment described herein may have a power bus 555 with a 2 volt or less voltage. For a negative ESD charge on ball 211B, ESD current may be conducted from dtd interface node 411 to ground 556 via diode 525.

It should be understood that ball 211B is coupled to three ESD discharge circuits for ESD protection of input driver 501 and output driver 515. Additionally, diode 526 may be considered, but is ignored for purposes of clarity.

Each of ESD circuits 521, 522, and 525 has forward bias impedance associated therewith. It should be understood that the forward biased impedance of each of ESD circuits 521, 522, and 523 is relatively low such that ESD discharge current is directed either to ground 556 or power bus 555. This low resistive ESD routing provided by dedicated ESD devices, such as diodes in this embodiment, is combined with resistance of a signal path. In other words, rather than trying to decouple active circuitry from dtd interface node 411 such as with a resistor or capacitor, or a combination thereof, resistance associated with conductive line 401, as well as balls 211B and 212B, may be used as part of the signal path resistance for ESD protection. By using signal path resistance, the addition of a resistor or capacitor, or both, is avoided which saves chip area and avoids adding more parasitic circuits to the signal path. In other words, for example, a designer may use a TSV interface without considering overhead of an ESD path. Once such designer has completed a circuit design, such ESD discharge path may be designed to be a fraction of the impedance of the active circuitry path.

Even though the example of a microbump and interposer die-to-die interface is described, it should be understood that any pad interface may be used. However, a microbump ESD interface may be set for 100 volts HBM, which may be equated to a 50 milliamp current pulse for 50 nanoseconds. A microbump interface generally can handle stress associated with 100 volt HBM. In other words, native routing resources with no additional ESD routing may be implemented in a signal path. Such additional though small bypass routing may be a small fraction of main signal routing, and such bypass routing may divert a 50 milliamp-50 nanosecond pulse away from active circuitry for purposes of ESD protection.

ESD circuits 521, 522, and 525 may each have an associated forward bias impedance. For purposes of clarity by way of example and not limitation, it shall be assumed that this impedance is normalized to a unitary value. Thus, for example, forward bias impedance of ESD circuit 521 is 1. Likewise, forward bias impedance of ESD circuits 522 and 525 are each respectively 1. Along those lines, input impedance 511 and input impedance 512 are each normalized to a value of 4. Thus, the ratio of input impedance of a driver circuit to forward bias impedance of an ESD circuit is four to one ("4:1") in this example. This ratio of 4:1 provides sufficient ESD protection for a 100 volts HBM and is generally able to steer ESD discharge away from dtd interface elements into said ESD network.

However, it should be understood that the exact unitary values as described herein are not required. Thus for example, the forward bias impedance of any one or more of ESD circuits 521, 522, and 525 may be greater than a unitary value of 1, provided the ratio of an input impedance of a driver circuit to forward bias impedance of the largest impedance of ESD circuits, such as ESD circuits 521, 522, and 525, is at least approximately 4:1 in order to provide sufficient ESD protection with respect to a 100 volts HBM. In other words, input impedance 511 or 512 may be greater than 4 units which would enhance ESD protection in those instances where the ratio is 5:1, 6:1, or greater with respect to a largest forward bias impedance of respective ESD circuits associated with die 201 and dtd interface node 411.

Thus, each ratio of input impedance of a driver circuit to forward bias impedance of an ESD circuit is at least approximately 4:1 for ESD protection for a 100 volt HBM. It should be understood that other ESD protection levels, such as greater than 100 volts but less than a conventional 1000 volt or higher ESD protection may be implemented; however, if fabrication facilities are controlled to lower ESD voltage levels of exposure, then such additional ESD protection may be unnecessary and may adversely impact performance as compared with less obtrusive 100 volt HBM ESD protection. It should be understood that "fabrication facilities" generally means where dies are attached to one another, coupled to one another via a substrate or an interposer, or the like. Furthermore, "fabrication facilities" may include where an MCM is encapsulated, covered, or the like.

Die 202 has same or similar circuitry and input impedance to forward bias impedance ratios as die 201. In other words, such driver circuit input impedance to forward bias impedance of ESD circuits is at least approximately 4:1 for each input impedance to each ESD discharge circuit path in a forward bias direction. Thus, duplicate description is avoided for purposes of clarity. However, it should be understood that balls 211B and 212B and conductive line 401 in combination have an associated resistance. Such resistance may be used to avoid having to adversely scale circuitry for meeting ratios as described herein.

For purposes of clarity by way of example and not limitation, some numerical values, including conventional comparison values, are provided. However, it should be understood that other numerical values may be used. In some conventional ESD routing, routing resistance for ESD paths is in a range of approximately 1 to 3 ohms. A conventional ESD HBM specification may be 2 kilovolts. With these general values, it should be understood that approximately 1.5 amps of ESD current may be discharged. Such ESD current as well as ESD path resistance results in ESD current-resistance ("IR") drop of approximately 3 to 5 volts, which is generally a safe voltage range for conventional external I/O interfaces. However, for a fabrication facility where ESD exposure is generally limited to 100 volt HBM, an ESD conductive path for discharge may be as high as approximately 10 to 20 ohms, provided however that such ESD forward bias impedance is a fraction of the impedance of a signal path. Again, this fraction is described as being at least approximately 4:1 with respect to input impedance of a driver circuit and forward bias impedance of an ESD circuit. For a microbump dtd interface with a 50 milliamp ESD current, an IR drop would be approximately 0.5 to 1 volts. Such an IR drop would generally be a safe voltage range for a microbump dtd interface.

Accordingly, it should be understood that specifying a low resistance for an ESD path to either or both a ground bus 556 or a power bus 555 may be replaced with a ratio specification for ESD routing. Thus, there may be an absence of high impedance lumped ESD decoupling components such as large resistors or capacitors, or a combination thereof.

Continuing the above numerical example, a circuit designer may design a microbump dtd interface and circuits associated therewith without necessarily having to consider overhead of an ESD path. Thus, once such circuit design is completed, provided an ESD path is a fraction of the impedance of an active path, such as input impedance of a driver, then such microbump dtd interface circuitry should be sufficiently protected. Even though the description provided herein may be used for any pad interface, a microbump dtd interface implementation is useful for a 100 volt HBM. A 100 volt HBM is generally equivalent to a 50 milliamp pulse of current for about 50 nanoseconds. Thus, generally a microbump dtd interface may handle 100 volt HBM stress using its native routing resources with no additional ESD routing for such signal path. In other words, diodes 521, 523, 524, and 525, where diodes 523 and 524 are provided in series, may be generally relatively small to provide bypass routing which is a small fraction of main signal routing. This bypass routing is sufficient to divert a 50 milliamp-50 nanosecond pulse away from active circuitry, such as input and output drivers, keeping such active circuitry generally immune from ESD associated with a 100 volt HBM.

It should further be understood that even though a straight point-to-point line is illustratively depicted for conductive line 401, such conductive line may be multiple conductive lines in parallel, may be a serpentine or other circuitous routing of a conductive line, or other approach to decreasing resistance, or a combination of any of the above for adjusting resistance or routing. Such adjustment in resistance may be used to affect the signal path ratio, namely to provide at least approximately a 4:1 ratio as described elsewhere herein, without having to change die design. In other words, signal path resistance may be increased, thus allowing ESD circuit resistances to be sufficiently small to at least approximate such 4:1 ratio as described elsewhere herein. Thus, with continued reference to the above numerical example, with the addition of resistance of conductive line 401, where resistance of balls 211B and 212B is assumed to be negligible, a forward bias resistance of ESD circuits 521, 522, and 525 may each be approximately 10 to 20 ohms while still having at least a 4:1 ratio as described elsewhere herein.

Figure 5B:
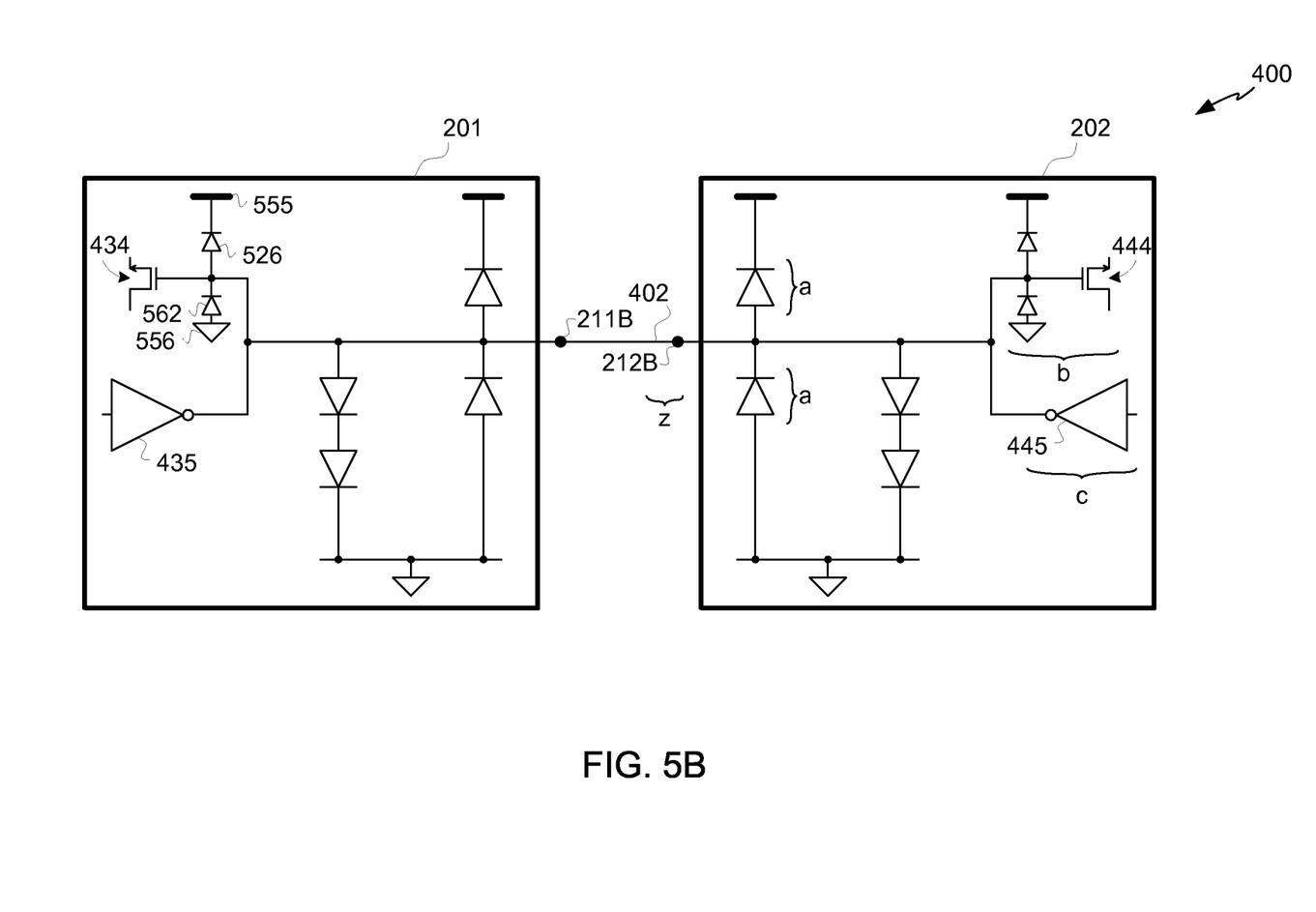
FIG. 5B is a block/circuit diagram depicting an exemplary embodiment of the MCM of FIGS. 4A, 4B, and 5A for communicating a clock signal via a conductive line or for communicating configuration data for a programmable resource application.

FIG. 5B is a block/circuit diagram depicting an exemplary embodiment of MCM 400 for communicating a clock signal via a conductive line 402, or for communicating configuration data for a programmable resource application. Die 201 circuitry is generally the same as die 201 circuitry of FIG. 5A, except n-channel transistor 501 is replaced with n-channel transistor 434 as previously described and an additional parasitic diode 562 is added.

Parasitic diode 562 is coupled in forward bias direction from ground bus 556 to a gate of n-channel transistor 434. So other than taking into account any input resistance associated with parasitic diode 562, as well as differences between input resistance as between transistors 434 and 501, generally the above description with reference to FIG. 5A is the same for FIG. 5B, and thus is not repeated for purposes of clarity. While parasitic diode 562 may be taken into account for ESD protection, such diode is ignored herein for purposes of clarity.

With simultaneous reference to FIGS. 5A and 5B, the following resistance rules are described. Resistance from z to b ("Rzb") may be mathematically related to resistance from a to z ("Raz") as:

$Raz \le \frac{1}{4}(Rzb).$

Likewise, resistance from z to c ("Rzc") may be mathematically related to the resistance from a to z as:

$Raz \le \frac{1}{4}(Rzc).$

It is sufficient that both resistances Rzb and Rzc meet the threshold ratio of 4:1, as previously described. It is not necessary however that all ratios are equivalent. Accordingly, a combined mathematical expression for such resistances may be expressed as:

$Raz \le \frac{1}{4}\min(Rzc:Rzb).$

In other words, the minimum ratio of Rzc to Raz and Rzb to Raz is at least equal to or greater than 4:1, as other larger ratios, such as 5:1 and 6:1 for example, may be used. Power and ground routing for ESD circuits, such as ESD diodes 521, 523, 524, and 525 may be set to be equal to or less than resistance Raz.

Figure 6:
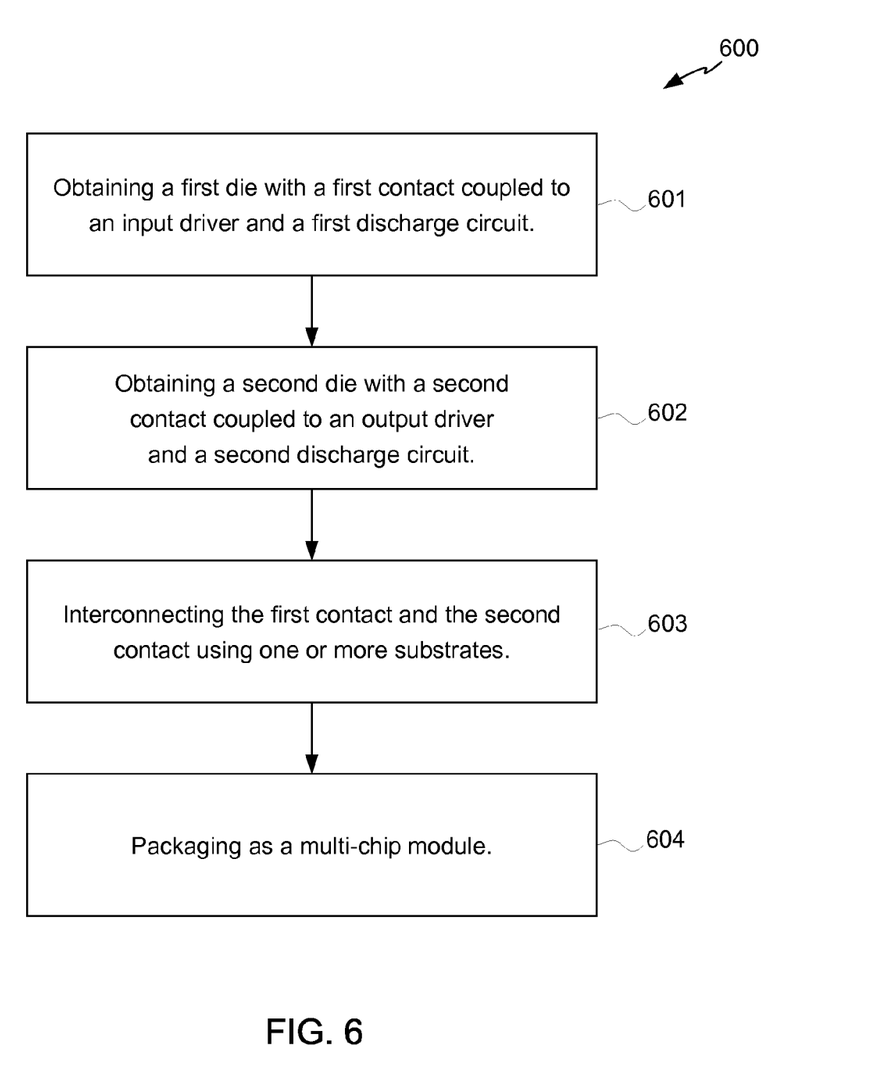
FIG. 6 is a flow diagram depicting an exemplary embodiment of an MCM assembly flow.

FIG. 6 is a flow diagram depicting an exemplary embodiment of an MCM assembly flow 600. MCM assembly flow 600 is further described with simultaneous reference to FIGS. 2A, 2B, 3A, 3B, 4A, 4B, 5A, and 5B.

At 601, a first die with a first contact is obtained. Such first die may be die 201, as previously described. Such first contact may be coupled to an input driver and a first discharge circuit. At 602, a second die may be obtained. Such second die may be die 202, as previously described. Such second die has a second contact coupled to an output driver and a second discharge circuit. It should be understood that such first and second discharge circuits are ESD circuits for a dtd interface.

The input driver has a first impedance and the output driver has a second input impedance. It should be understood that the input and output drivers of the respective first and second die may be coupled to one another, such as via a conductive line, as previously described. The first discharge circuit is for protecting the input driver from an ESD event, and the second discharge circuit is for protecting the output driver from an ESD event, where the first contact and the second contact are temporarily exposed. Such ESD protection may be for a 100 volt HBM as previously described.

Along those lines, the first discharge circuit may have a first forward bias impedance and the second discharge circuit may have a second forward bias impedance, where the first forward bias impedance and the second forward bias impedance are targeted to a specified minimum resistance ratio. More particularly, the first input impedance associated with the input driver may have a unit value of 4 or larger with respect to a unitary value of the first forward bias impedance of the first discharge circuit. Again, values have been normalized for purposes of clarity and not limitation. Likewise, the second input impedance of the output driver may have a unit value of 4 or larger with respect to a unitary value of the second forward bias impedance of the second discharge circuit. Accordingly, at least a 4:1 ratio of input impedance to forward bias impedance exists in both the first die obtained at 601 and the second die obtained at 602.

At 603, the first contact and the second contact may be interconnected via a conductive line and dtd interface contacts associated with at least one substrate, as previously described herein, which in turn couples the output driver of the second die to the input driver of the first die for subsequent communication. It should be understood that this interconnection may be any form of dtd interconnecting of two die for an MCM, and thus may include the examples described respectively with reference to FIGS. 2B and 3B. It should further be understood that handling of the first die and handling of the second die may be independent of one another but may be in a fabrication facility which has ESD control, and such ESD control is to a 100 volt HBM or an HBM voltage less than 100 volts, and in any event less than a 1000 volts HBM. Accordingly, first and second discharge circuits may be tailored to manufacturing environments with ESD controls.

It should further be understood that resistance of the interconnect at 603 does not come into signal path resistance as part of the resistance equation until after the first die and the second die are interconnected. Thus, it may be desirable to make the resistance associated with such interconnection negligible so as not to adversely impact the at least approximately 4:1 ratio as previously described herein. In another embodiment, the resistance of the interconnect at 603 may be used to ensure that the at least approximately 4:1 ratio as previously described herein is met for handling after assembly of the first die and the second die but prior to packaging, such as by encapsulating or covering. It should be understood that a manufacturing facility may have different levels of ESD protection throughout the assembly flow of an MCM. Such ESD protection may be stricter earlier in such flow than later in such flow.

At 604, the first die and the second die, along with at least one substrate used to interconnect the first die and the second die at 603, are packaged as part of an MCM. After such packaging, the first contact, the second contact, and an interconnect therebetween for interconnecting the first contact and the second contact, may be completely concealed after such packaging.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A die for a multi-chip module, comprising:
a contact having an externally exposed surface after the formation of the die and prior to assembly of the multi-chip module, wherein the contact is for a die-to-die interconnect of the multi-chip module, and the contact is an internal node of the multi-chip module after assembly of the multi-chip module;
a driver circuit, coupled to the contact, having a first input impedance;
a discharge circuit, coupled to the contact, to provide electrostatic discharge protection of the driver circuit;
wherein the discharge circuit has a first impedance associated with a first portion of the discharge circuit, and the first impedance is a fraction of the first input impedance;
wherein the first portion of the discharge circuit comprises a first diode that is coupled to the contact in a forward biased direction;
wherein a second portion of the discharge circuit comprises a second diode that is coupled to the contact in a reverse biased direction;
wherein a third portion of the discharge circuit comprises a third diode that is coupled to the contact in the forward biased direction, and a fourth diode that is coupled to the third diode in series and in the forward biased direction; and
wherein a first ratio of the first input impedance to the first impedance is at least 4 to 1 for the electrostatic discharge protection.

2. The die, according to claim 1, wherein:
the discharge circuit has a second impedance associated with the second portion of the discharge circuit; and
a second ratio of the first input impedance to the second impedance is at least 4 to 1 for the electrostatic discharge protection.

3. The die, according to claim 1, wherein the driver circuit is an input driver or an output driver.

4. The die, according to claim 1, wherein:
the driver circuit includes an input driver and an output driver coupled to one another at a node common connected to the contact;
the input driver circuit has the first input impedance;
the output driver has a second input impedance;
the first ratio of the first input impedance to the first impedance is at least approximately 4 to 1 for the electrostatic discharge protection of the input driver; and
a second ratio of the second input impedance to the first impedance is at least approximately 4 to 1 for the electrostatic discharge protection of the output driver.

5. The die, according to claim 4, wherein:
the discharge circuit has a second impedance associated with the second portion of the discharge circuit;
a third ratio of the first input impedance to the second impedance is at least approximately 4 to 1 for the electrostatic discharge protection of the input driver; and
a fourth ratio of the second input impedance to the second impedance is at least approximately 4 to 1 for the electrostatic discharge protection of the output driver.

6. The die, according to claim 2, wherein the electrostatic discharge protection of the driver circuit is for a 100 volt Human Body Model.

7. The die, according to claim 6, wherein the first portion of the discharge circuit and the second portion of the discharge circuit are respectively coupled to power and ground.

8. The die, according to claim 6, wherein:
the input driver is a multiplexer; and
the output driver is an output buffer.

9. A multi-chip module, comprising:
a first die having a first contact;
a second die having a second contact;
a substrate to which the first die and the second die are attached, wherein the first contact and the second contact are coupled to one another via a conductor of the substrate to provide an internal node after assembly of the multi-chip module;
an input driver of the first die coupled to the first contact, wherein the input driver has a first input impedance;
an output driver of the second die coupled to the second contact, wherein the output driver has a second input impedance;
a first discharge circuit of the first die coupled to the first contact to provide first electrostatic discharge protection;
a second discharge circuit of the second die coupled to the second contact to provide second electrostatic discharge protection;
wherein the first discharge circuit has a first impedance associated with a first portion of the first discharge circuit, and the first impedance is a fraction of the first input impedance;
wherein the first portion of the discharge circuit comprises a first diode that is coupled to the first contact in a forward biased direction;
wherein a second portion of the first discharge circuit comprises a second diode that is coupled to the first contact in a reverse biased direction;
wherein a third portion of the first discharge circuit comprises a third diode that is coupled to the first contact in the forward biased direction, and a fourth diode that is coupled to the third diode in series and in the forward biased direction, and the second discharge circuit has a second impedance;

wherein the second impedance is a fraction of the second input impedance; and wherein a first ratio of the first input impedance to the first impedance is at least 4 to 1 for the first electrostatic discharge protection.

10. The multi-chip module, according to claim 9, wherein a second ratio of the second input impedance to the second impedance is at least 4 to 1 for the second electrostatic discharge protection.

11. The multi-chip module, according to claim 9, wherein the substrate is selected from a group consisting of a laminated substrate, a deposited substrate, and a ceramic substrate.

12. The multi-chip module, according to claim 9, wherein the conductor is formed in part using a subsurface level conductive line in the substrate.

13. The multi-chip module, according to claim 9, wherein the first electrostatic discharge protection is for a 100 volt Human Body Model, and the first impedance is in a range of approximately 10 to 20 Ohms.

14. The multi-chip module, according to claim 13, wherein:
the second electrostatic discharge protection is for a 100 volt Human Body Model; and
the second impedance is in a range of approximately 10 to 20 Ohms.

15. The multi-chip module, according to claim 9, wherein the substrate is selected from a group consisting of an integral interposer and a non-integral interposer.

16. The multi-chip module, according to claim 9, wherein the first die and the second die attached via the substrate provide a vertical chip-stacked package after the assembly of the multi-chip module.

17. The multi-chip module, according to claim 9, wherein the first die and the second die attached via the substrate provide a horizontal chip package after the assembly of the multi-chip module.

18. A method of providing a multi-chip module, comprising:
obtaining a first die with a first contact coupled to an input driver and a first discharge circuit, wherein the input driver has a first input impedance;
obtaining a second die with a second contact coupled to an output driver and a second discharge circuit, wherein the output driver has a second input impedance;
interconnecting the first contact and the second contact;
packaging the multi-chip module;
after the packaging of the multi-chip module, completely concealing the first contact, the second contact, and an interconnect between the first contact and the second contact;
wherein the first discharge circuit of the first die is coupled to the first contact to provide electrostatic discharge protection of the input driver, and the second discharge circuit of the second die is coupled to the second contact to provide electrostatic discharge protection of the output driver;
wherein the first discharge circuit has a first impedance associated with a first portion of the first charge circuit, and the first impedance is a fraction of the first input impedance;
wherein the first portion of the discharge circuit comprises a first diode that is coupled to the first contact in a forward biased direction;
wherein a second portion of the first discharge circuit comprises a second diode that is coupled to the first contact in a reverse biased direction; and
wherein a third portion of the discharge circuit comprises a third diode that is coupled to the first contact in the forward biased direction, and a fourth diode that is coupled to the diode in series and in the forward biased direction;
wherein the second discharge circuit has a second impedance;
wherein the second impedance is a fraction of the second input impedance; and
wherein a first ratio of the first input impedance to the first impedance is at least 4 to 1, and a second ratio of the second input impedance to the second impedance is at least 4 to 1.

19. The method, according to claim 18, wherein the electrostatic discharge protection for the input driver and the output driver is a 100 volt Human Body Model.

* * * * *